United States Patent [19]

Jewell et al.

[11] Patent Number: 5,034,344

[45] Date of Patent: Jul. 23, 1991

[54] METHOD OF MAKING A SURFACE EMITTING SEMICONDUCTOR LASER

[75] Inventors: Jack L. Jewell, Bridgewater; Axel Scherer, Matawan, both of N.J.

[73] Assignees: Bell Communications Research, Inc., Livingston; AT&T-Bell Laboratories, Murray Hill, both of N.J.

[21] Appl. No.: 538,577

[22] Filed: Jun. 18, 1990

Related U.S. Application Data

[62] Division of Ser. No. 380,996, Jul. 17, 1989, Pat. No. 4,949,350.

[51] Int. Cl.⁵ .................. H01L 21/306; H01L 21/329; H01L 21/80; H01L 29/205
[52] U.S. Cl. ..................................... 437/129; 156/649
[58] Field of Search ................ 437/129, 184; 156/643, 156/649; 372/45

[56] References Cited

U.S. PATENT DOCUMENTS

| | | | |
|---|---|---|---|
| 4,309,670 | 1/1982 | Burnham et al. | 331/94.5 H |
| 4,675,876 | 6/1987 | Suilans | 372/45 |

FOREIGN PATENT DOCUMENTS

| | | | |
|---|---|---|---|
| 0010685 | 1/1985 | Japan | 372/45 |
| 0083389 | 5/1985 | Japan | 372/45 |
| 0097684 | 5/1985 | Japan | 372/45 |
| 0079280 | 4/1986 | Japan | 372/45 |
| 0174687 | 8/1986 | Japan | 372/45 |
| 0053989 | 3/1988 | Japan | 372/45 |
| 0116483 | 5/1988 | Japan | 372/45 |

OTHER PUBLICATIONS

High Efficiency TEMoo Continuous Wave (Al,Ga) As Epitaxial Surface Emitting Laser P. L. Gourley, et al., Appl. Phy. Lett., vol. 54, No. 13, Mar. 27, 89 pp. 1209–1211.
Effects of Ion Species and Adsorb Gas on Dry Etching Induced Damage on GaAs. S. W. Pang, et al., J. Vac. Soc. Tech. B, vol. 13, No. 1 Jan./Feb. 85, pp. 398–401.
Delta Doped Ohmie Contacts to n-GaAs E. F. Schubert, et al., Appl. Phys. Lett., Aug. 4, 86 49(5).
Distributed Feedback Surface Emitting Laser Diode with Multilayers Heterostructure Mutsuo Ogura, et al., Jap. J. of Appl. Phys. 23(7) Jul. 84, pp. L512–L514.
T. Sakaguchi et al., "Vertical Cavity Surface-Emitting Laser with an AlGaAs/AlAs Bragg Reflector," Electronics Letters, 1988, vol. 24, pp. 928–929.
J. L. Jewell et al., "GaAs-AlAs Monolithic Microresonator Arrays," Applied Physics Letters, 1987, vol. 51, pp. 94–96.
J. L. Jewell et al., "Lasting Characteristics of GaAs Microresonators," Applied Physics Letters, 1989, vol. 54, pp. 1400–1402.
C. K. Peng et al., "Extremely Low Resistance Nonalloyed Ohmic Contacts in GaAs Using InAs/InGaAs and InAs/GaAs Strained-Layer Sueprlattices," Applied Physics Letters, 1988, vol. 53, pp. 900–901.
S. Kinoshita et al., "Reproducible Fabrication of AlGaAs/GaAs Circular Buried Heterostructure (CBH) Surface-Emitting Lasers with Low Thresholds," Electronics Letters, 1988, vol. 24, pp. 699–700.
K. Iga et al., "Surface Emitting Semiconductor Laser Array: Its Advantage and Future," Journal of Vacuum Science Technology A, 1989, vol. 7, pp. 842–846.
A. Scherer et al., "Electrical Damage Induced by Ion Beam Etching of GaAs," Journal of Vacuum Science Technology B, 1988, vol. 6, pp. 277–279.
C. J. Sandroff et al., "Electronic Passivation of GaAs Surfaces Through the Formation of Arsenic–Sulfur Bonds," Applied Physics Letters, 1989, vol. 54, pp. 362–364.
A. Ibaraki et al., "Buried Heterostructure GaAs/-GaAlAs Distributed Bragg Reflector Surface Emitting Laser with Very Low Threshold (5.2 mA) Under Room Temperature CW Conditions," Japanese Journal of Applied Physics, 1989, vol. 28, pp. L667–L668.

Primary Examiner—Olik Chaudhuri
Attorney, Agent, or Firm—James W. Falk; Charles S. Guenzer

[57] ABSTRACT

A method of making a vertical-cavity surface emitting laser and method of making in which a III-V heterostructure is epitaxially grown to include a quantum well active region between two interference mirrors separated by an emitting wavelength of the quantum well region. A small pillar of this heterostructure is etched by chemically assisted xenon ion beam etching. Prior to etching, a top metal contact is deposited on the epitaxial semiconductor. Light is emitted through the substrate having a bandgap larger than that of the quantum well region.

20 Claims, 6 Drawing Sheets

METHOD OF MAKING A SURFACE EMITTING SEMICONDUCTOR LASER

RELATED APPLICATIONS

This application is a division of Ser. No. 07/380,996, filed July 17, 1989, now U.S. Pat. No. 4,949,350.

FIELD OF THE INVENTION

The invention relates generally to semiconductor lasers. In particular, the invention relates to vertically arranged heterostructure lasers including quantum wells and interference mirrors and the method of making them.

BACKGROUND OF THE INVENTION

Semiconductor lasers are well known and of great importance. One type, which has been explored recently, is a vertical-cavity, surface emitting laser. Such a laser relies on precisely controlled epitaxial growth of semiconducting material of varying composition. A vertical (planar) Fabry-Perot optical resonator is epitaxially formed on the substrate. Two semiconductor multilayer interference mirrors surround an active region. The lasing wavelength is determined by the bandgap of the active region and the distance between the mirrors is set to this wavelength or a multiple thereof. It has further been recognized that the active region can be formed of one or more quantum wells, to which the carriers are confined, thus increasing the lasing efficiency. A quantum well layer is a semiconductor layer of such thinness that its bandgap is determined by both its composition and it thickness. For the AlGaAs and InAlAsP families of III-V materials, these quantum effects occur at thicknesses of 100 nm or less.

However, known vertical-cavity, surface emitting lasers are not completely satisfactory. Much of the reported work has described optically pumped lasers. Optical pumping eliminates the need for metallic or at least highly conducting semiconducting contacts, which tend to absorb light. However, electrical pumping is much preferred for most applications.

Much of the reported work also involves relatively large laser areas. For many applications, only a small quantity of light is required and low power consumption is highly desirable. That is, it is desired that the vertical-cavity laser have a small cross-section. Furthermore, a small cross-sectional cavity provides better directionality and smaller linewidths. Sakaguchi et al have reported in an article entitled "Vertical cavity surface-emitting laser with an AlGaAs/AlAs Bragg reflector" appearing in Electronics Letters, volume 24, 1988 at pages 928 and 929 a laser having a single semiconductor interference mirror and a cavity defined by a surface ring electrode. However, the 20 $\mu$m diameter is considered too high.

We have previously reported in an article by Jewell et al entitled "GaAs-AlAs monolithic microresonator arrays" appearing in Applied Physics Letters, volume 51, 1987 at pages 94-96 1.5 $\mu$m diameter Fabry-Perot resonators. Recently, we disclosed the optically pumped lasing of such resonators in an article by Jewell et al entitled "Lasing characteristics of GaAs microresonators" appearing in Applied Physics Letters, volume 54, 1989 at pages 1400-1402. Gourley et al have disclosed a similar but laterally undefined lasing structure in a technical article entitled "High-efficiency TEM$_{00}$ continuous-wave (Al,Ga)As epitaxial surface-emitting lasers and effect of half-wave periodic gain" appearing in Applied Physics Letters, volume 54, 1989 at pages 1209-1211. We consider the argon ion milling used for the devices disclosed in the two Jewell et al articles to produce excessive trapping at the sides of the pillars. In any case, this art does not disclose the electrical pumping of these narrow devices.

One of us, Jewell, has disclosed in U.S. Pat. No. 4,999,842 a vertical-cavity laser structure having one or two quantum wells and two interference mirrors. No details of the procedure to horizontally define the vertical cavity were provided.

SUMMARY OF THE INVENTION

Accordingly, an object of the invention is to provide a laser with a low threshold current.

A further object of the invention is to provide a vertical-cavity surface emitting laser.

A yet further object of the invention is to provide a method of making a surface emitting laser which minimizes junction barriers and carrier absorption.

The invention can be summarized as a vertical-cavity surface-emitting laser in which a vertical pillar of micrometer dimensions is formed with one or more quantum well layers having a bandgap smaller than that of the substrate. A cavity is defined within the pillar by alternating layers of material on each end forming interference mirrors. The quantum-well layers and spacers are formed between the mirrors to thicknesses such that a full wave exists between the mirrors. Electrical pumping of the laser is facilitated by heavily doping the bottom mirror and spacer and the substrate to one conductivity type and heavily doping the opposite conductivity type the upper spacer and mirror. A metallic surface contact is applied to the top mirror.

The electrical efficiency of the high aspect ratio pillar is obtained by using chemically assisted heavy ion beam etching to obtain the pillar structure and by depositing the surface contact to the semiconductor prior to etch-definition of the pillar.

DETAILED DESCRIPTION

Figure 1:
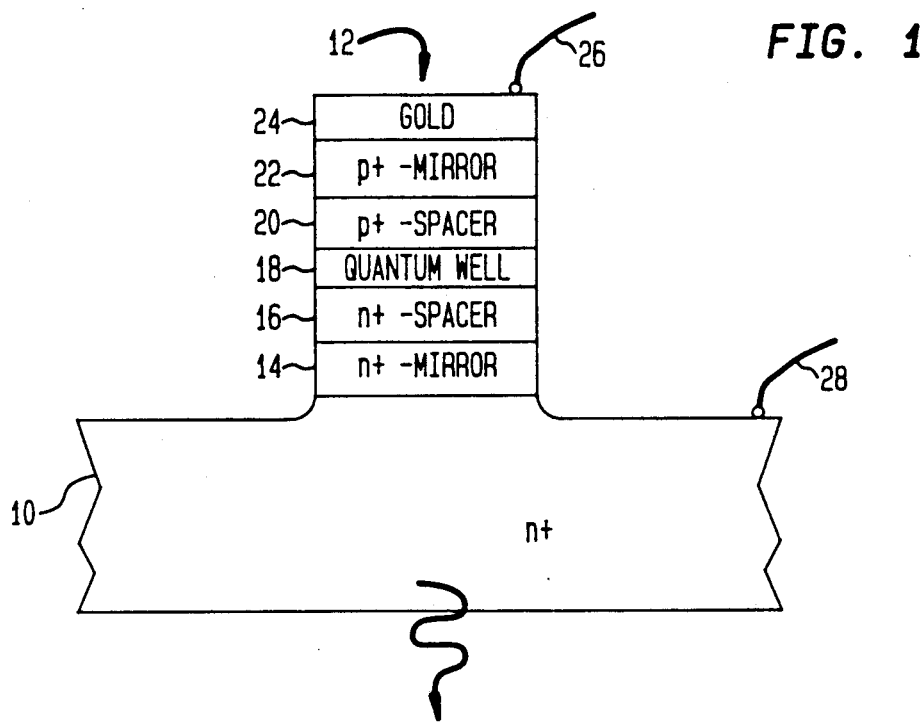
FIG. 1 is a cross-section of the general configuration of the electrically pumped surface emitting laser of the invention.

The present invention provides a vertical cavity, surface-emitting laser of high efficiency and small cross-section so that the lasing current threshold can be made very small. The general structure is illustrated in cross-section in FIG. 1. A vertical structure is epitaxially grown on a substrate 10. After growth, the vertical structure is lithographically defined into a pillar 12 having a diameter on the order of a few micrometers. The pillar 12 contains a vertical-cavity laser. Specifically, there are formed over the substrate 10 a lower mirror 14, a lower spacer 16, a quantum well region 18, an upper spacer 20, an upper mirror 22 and a gold contact layer 24.

The lasing action occurs in the quantum well region 18 at a wavelength determined by both the composition and the thickness of the quantum well layers to be described more completely later. The ends of the optical cavity are defined by the mirrors 14 and 22, each of which is a interference filter having multiple periods of two alternating materials of different refractive index. The thickness of each layer in the mirrors is one-quarter of the optical wavelength in that material of the lasing frequency so that the lasing light is mostly reflected back into the cavity by the mirrors 14 and 22. The thicknesses of the spacers 16 and 20 are chosen so that the optical distance between the opposing faces of the mirrors 14 and 22 is equal to the lasing wavelength and so that the quantum well layers are optically centered within the so defined cavity.

The gold layer 24 performs two functions. It reflects back into the optical cavity whatever light has not been reflected by the upper mirror 22 and further provides an electrical contact 26 for electrical pumping of the laser. Another electrical contact 28 is made to the substrate 10. Electrical pumping is further facilitated by making the upper spacer 20 and upper mirror 22 to be p+-type and by making the lower spacer 16, the lower mirror 14 and the substrate 10 to be n+-type.

The lower mirror 14 is not completely reflecting so that laser light is emitted through that mirror 14 and through the substrate 10. The composition of the lasing quantum well layers is chosen so that the remaining semiconductor regions 10, 14, 16, 20 and 22, even though heavily doped, are mostly transparent to the lasing wavelength.

The variety of electrical characteristics required of the epitaxial material grown in the pillar 12 is made possible by a family of multi-component semiconductor materials. The principal embodiment to be described below uses $In_{0.2}Ga_{0.8}As$ for the quantum well layers determining the lasing wavelength and further uses GaAs, AlAs and their alloys for the remaining structure. All these materials can be heteroepitaxially grown. Nonetheless, the successful fabrication of these pillar-type lasers to have minimum threshold current presents several difficulties.

First, the threshold current is reduced as the cross-section of the pillar is reduced. However, the sidewalls of the pillar introduce electrical defects. The smaller the cross-section of the pillar, the more dominating are the sidewall defects. Secondly, the power dissipation of a laser depends not only on the threshold current but also on the applied voltage. The structure described so far has a large number of interfaces. Interfaces between semiconductor layers and the metal-semiconductor interface tend to introduce voltage barriers. For instance, charged interface defects will deplete a neighboring semiconductor region, introducing a voltage drop across the interface across which the threshold current must travel.

In order to reduce the interface and sidewall defects in the vertical-cavity laser of FIG. 1, the design and fabrication of the experimentally verified laser of the invention included additional structure and unusual processing.

Figure 2:
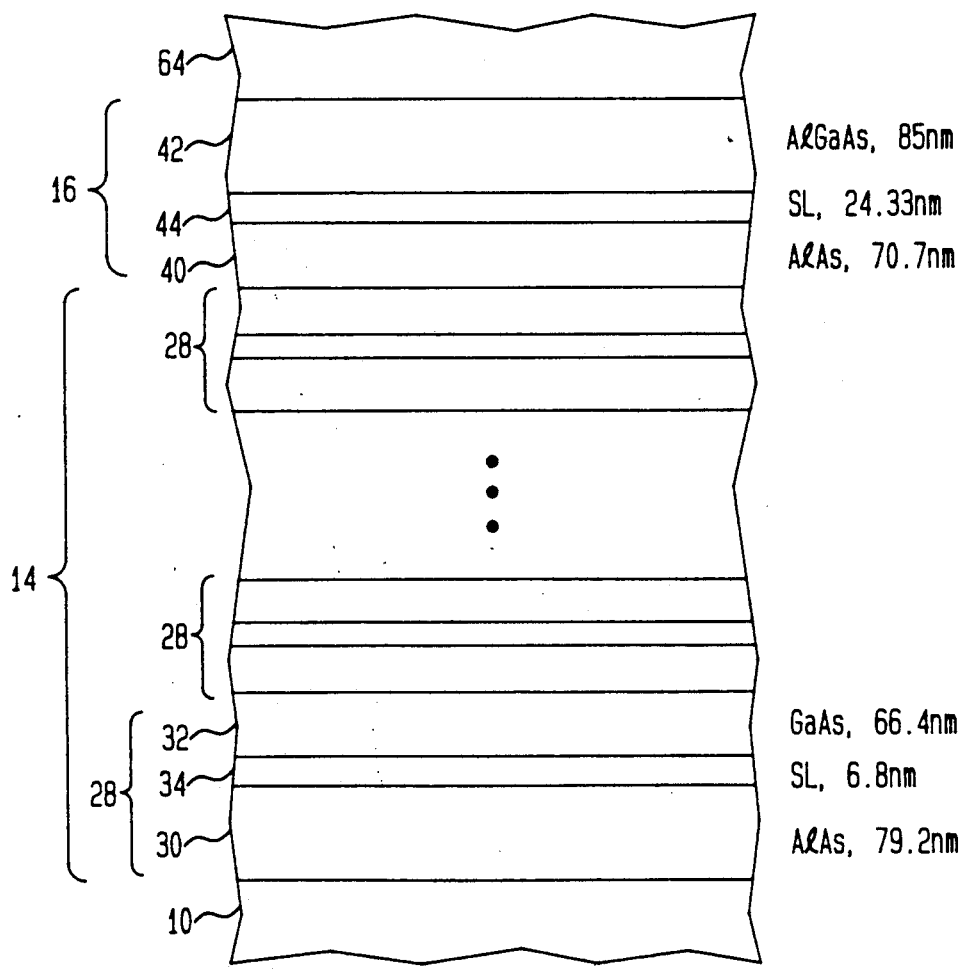
FIG. 2 is a cross-section of the bottom portion of a specific embodiment of the surface emitting laser of FIG. 1.
Figure 3:
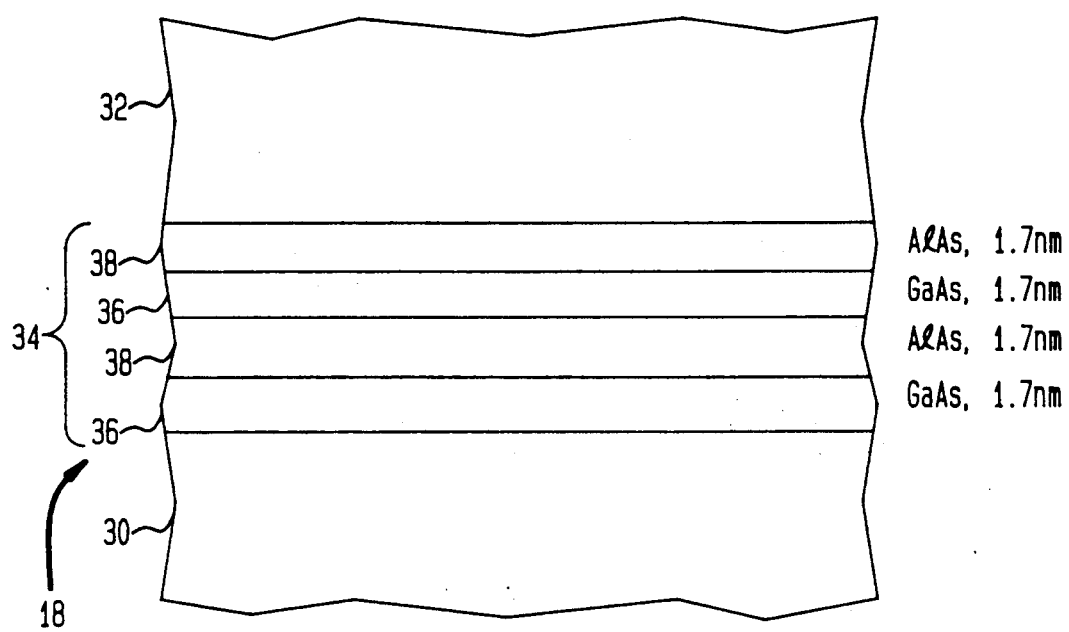
FIG. 3 and 4 are expanded cross-sections of portions of the cross-section of FIG. 2.

The epitaxial growth was performed by molecular beam epitaxy (MBE) using a GEN-II MBE station commercially available from Varian. This MBE station was equipped with effusion cells for Ga, Al, As, Si and Be. An n-type (100)-oriented GaAs wafer doped n+ with Si to $3 \times 10^{18} cm^{-3}$ was used for the substrate 10. The substrate 10 was cleaned by the standard MBE practice of oxidation and thermal oxide desorption in the growth chamber. After cleaning, the substrate 10 was placed in the MBE station and heated to 580° C. for epitaxial growth. First, a 0.5 μm GaAs buffer layer, not specifically illustrated, was grown with the same doping as the substrate 10. The lower mirror 14 and spacer 16 were then grown. As illustrated in FIG. 2, the lower mirror 14 consisted of twenty periods 28 of an AlAs layer 30 of 79.2 nm thickness and a GaAs layer 32 of 66.4 nm thickness. Between each pair of AlAs and GaAs layers 30 and 32 was formed a thin lower mirror superlattice 34. As shown in FIG. 3, the lower mirror superlattice layer 34 consisted of two GaAs layers 36 alternating with two AlAs layers 38. All these layers 36 and 38 were 1.7 nm thick. The superlattice 34 was used to reduce resistance, as has been reported by Peng et al in a technical article entitled "Extremely low resistance non-alloy ohmic contacts on GaAs using InAs/InGaAs and InAs/GaAs strained-layer superlattices", appearing in Applied Physics Letters, volume 54, 1988 at pages 900-901. All the layers 30, 32, 36 and 38 in the lower mirror 14 were doped n+ with $3 \times 10^{18} cm^{-3}$ of Si. The substrate 10 was spun during the deposition of the bottom eighteen of the twenty periods 28 of the lower mirror 14 in order to provide uniformity.

Figure 4:
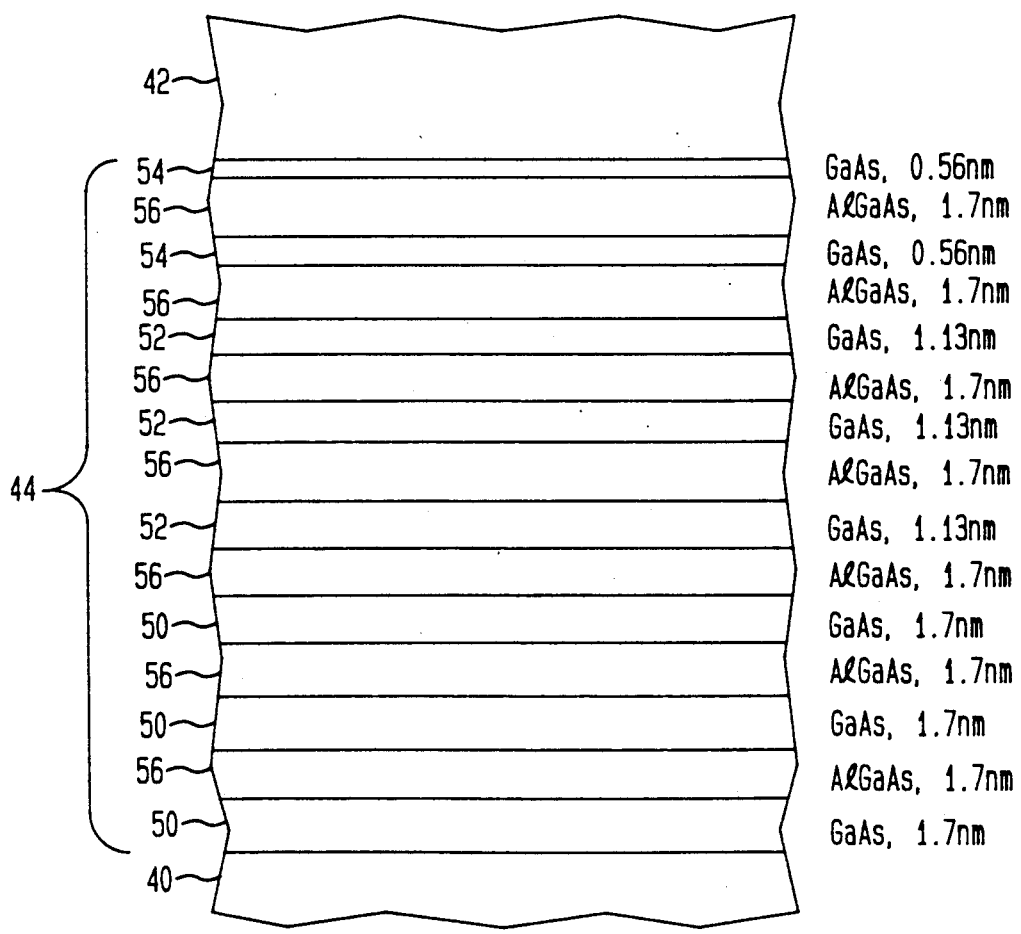

As further illustrated in FIG. 2, the lower spacer 16 consisted of an AlAs layer 40 of thickness 70.7 nm and an $Al_{0.5}Ga_{0.5}As$ layer 42 of 85 nm thickness separated by a lower spacer superlattice 44. As illustrated in FIG. 4, the lower spacer superlattice 44 consisted of eight GaAs layers 50, 52 and 54 alternating with seven $Al_{0.5}Ga_{0.5}As$ layers 56. All the AlGaAs layers 56 were of 1.7 nm thickness. However, the GaAs layer thickness decreased from the bottom toward the top. The bottom three layers 50 were of 1.7 nm thickness, the next three layers 52 were of 1.13 nm thickness while the top two layers 54 were of 0.56 nm thickness. All layers in the lower spacer 16 were similarly doped n+ with $3 \times 10^{18} cm^{-3}$ of Si.

Figure 5:
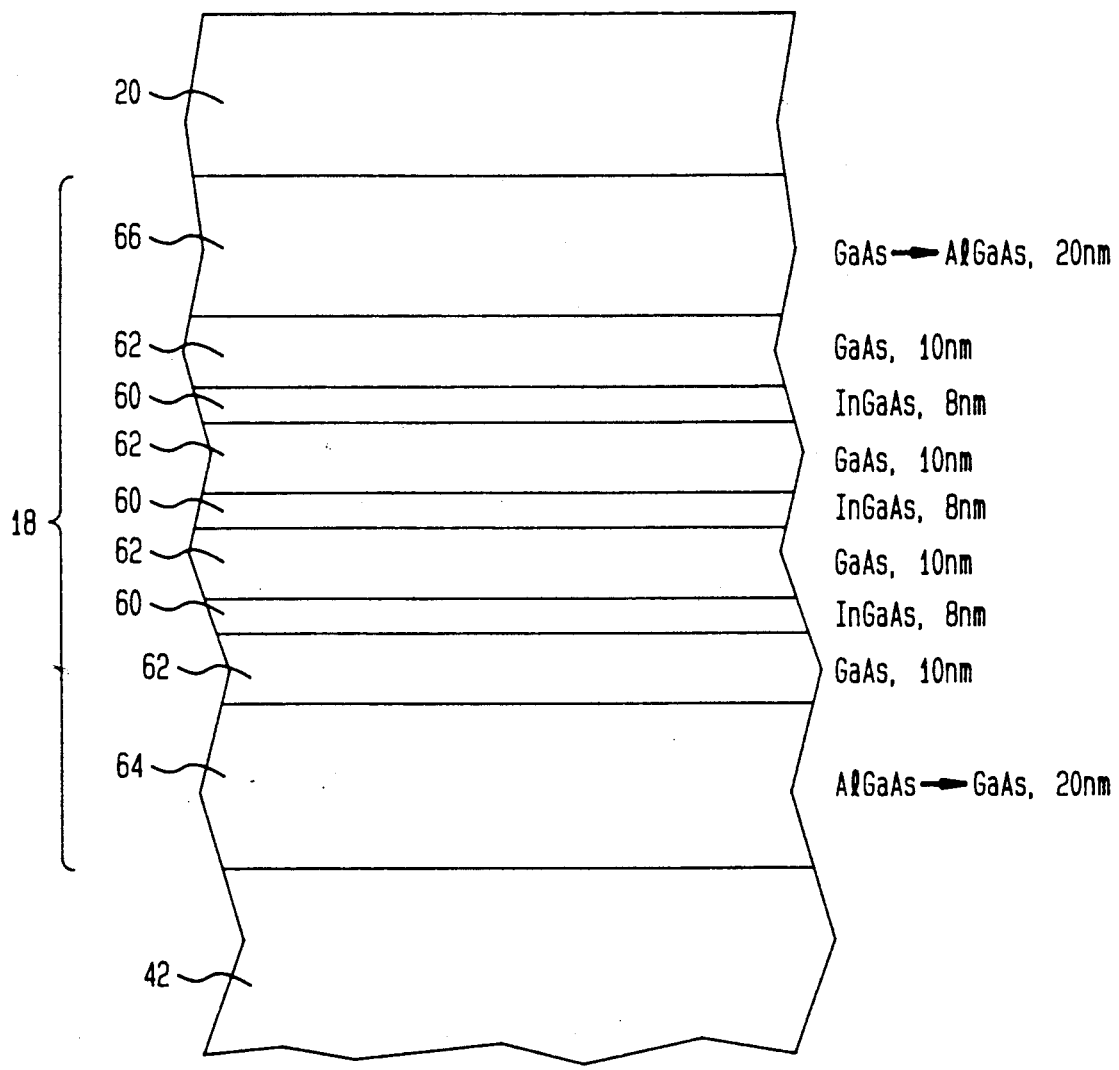
FIG. 5 is a cross-section of the middle portion of the embodiment of FIG. 2.

The quantum well region 18 consisted of three quantum wells with graded index regions on each side. One quantum well could have provided better efficiency. However, it was considered difficult to build. The quantum well structure is specifically illustrated in FIG. 5. Three active quantum well layers 60 of $In_{0.2}Ga_{0.8}As$ of thickness 8 nm were sandwiched between four GaAs layers 62 of thickness 10 nm. The lasing wavelength was determined by both the composition and thickness of the InGaAs layers 60. In order to better confine the carriers to the quantum well, there was provided a lower graded index layer 64 of thickness 20 nm which was linearly graded from $Al_{0.5}Ga_{0.5}As$ at the bottom to GaAs at the top. In growth, the composition was changed in 2 nm slices. Similarly, there was provided an upper graded index layer 66 of 20 nm thickness changing from GaAs to $Al_{0.5}Ga_{0.5}As$ during growth. All layers 60, 62, 64 and 66 in the quantum well region 18 were nominally undoped. During the growth of the quantum well region 18, the substrate temperature was reduced to 540° C.

Figure 6:
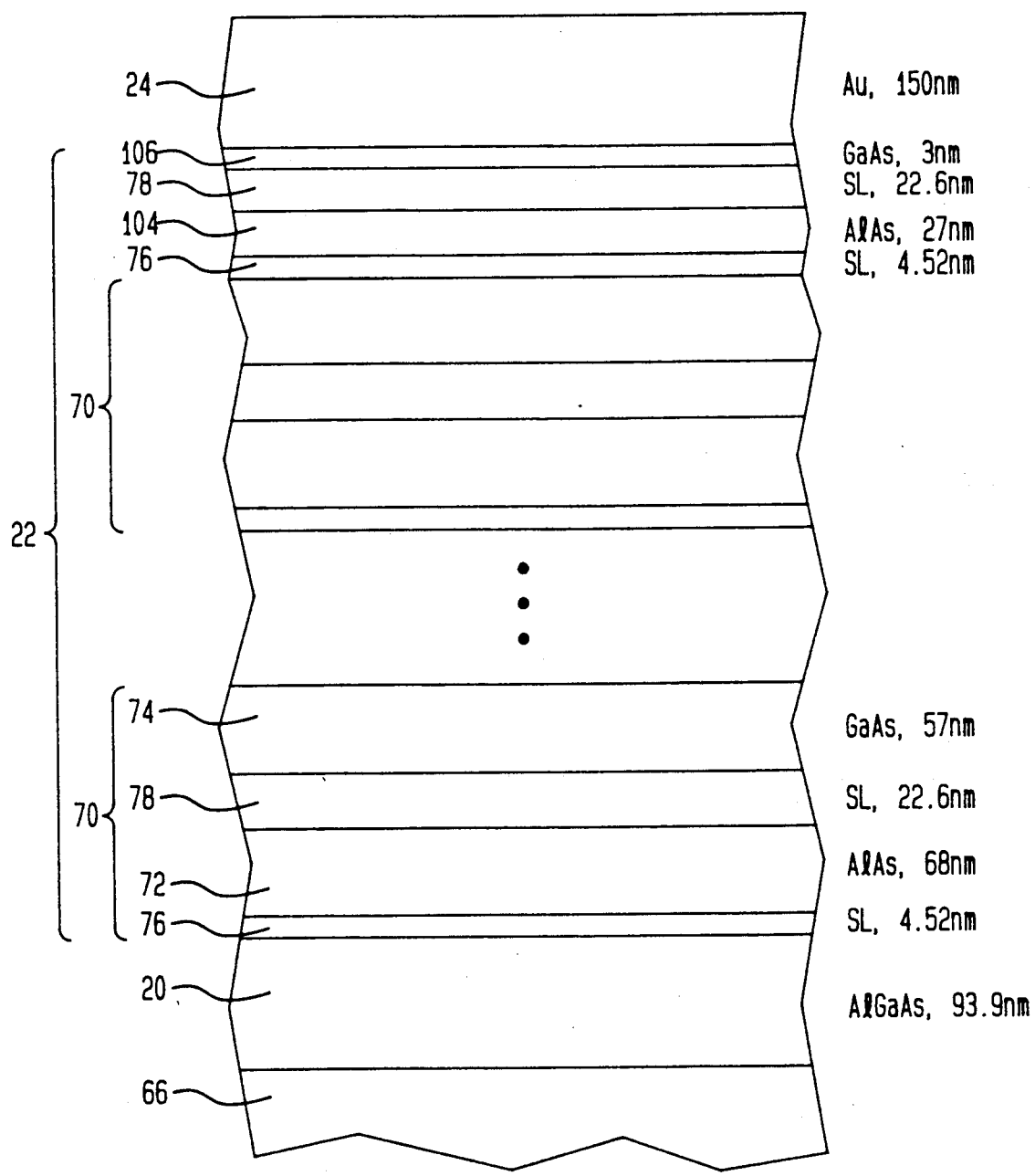
FIG. 6 is a cross-section of the top portion of the embodiment of FIG. 2.

As illustrated in FIG. 6, the upper spacer 20 consisted of a layer of $Al_{0.5}Ga_{0.5}As$ of thickness 93.9 nm doped p+ with $2.5\times10^{18} cm^{-3}$ of Be. Furthermore, for the deposition of the upper spacer 20 and mirror 22, the substrate temperature was raised again to 580° C.

Figure 7:
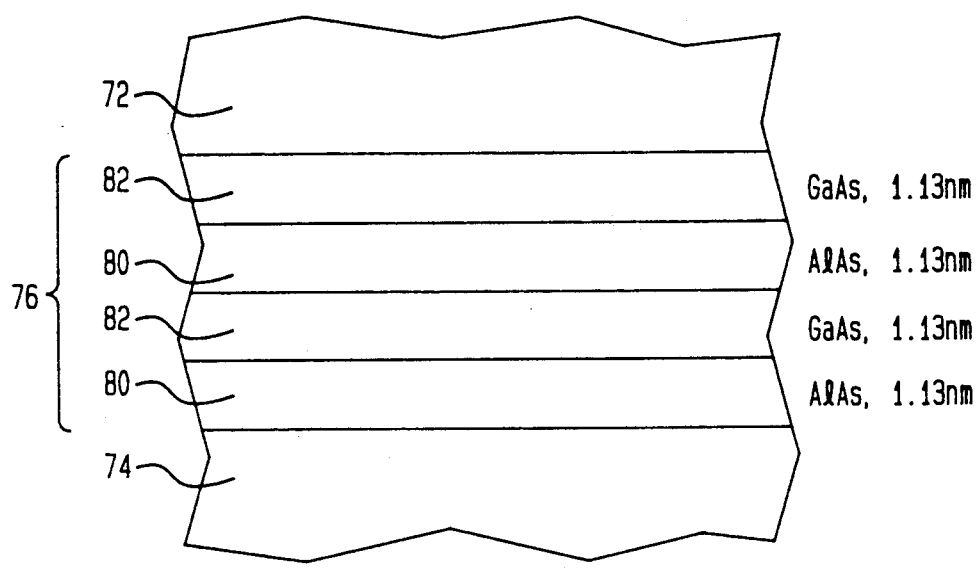
FIGS. 7 and 8 are expanded cross-sections of portions of the cross-section of FIG. 6.
Figure 8:
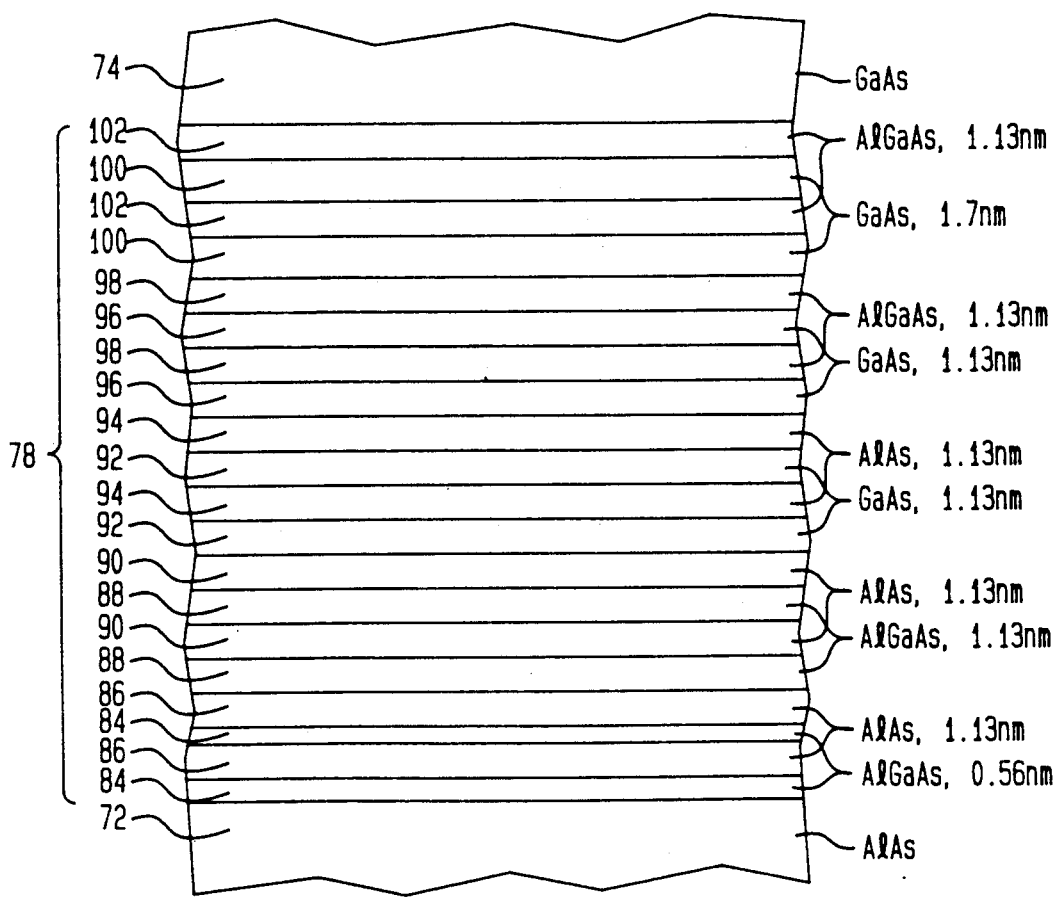

Most of the upper mirror 22 was composed of twelve periods 70 of an AlAs layer 72 of 68 nm thickness and a GaAs layer 74 of 57 nm thickness. Additionally, each period 70 contained first and second upper mirror superlattices 76 and 78 in order to facilitate electron transport between the AlAs and GaAs layers 72 and 74. As illustrated in FIG. 7, each first upper mirror superlattice 76 consisted of two AlAs layers 80 and two GaAs layers 82, all of 1.13 nm thickness. The second upper mirror superlattice 78 was considerably more complex and changed from a GaAs-rich superlattice at the bottom to an AlAs-rich one at the top in order to match the adjacent AlAs and GaAs layers 72 and 74. Specifically, as illustrated in FIG. 8, the second upper mirror superlattice 78 consisted of a first two-period superlattice of two $Al_{0.5}Ga_{0.5}As$ layers 84 of 0.56 nm thickness and two AlAs layers 86 of 1.13 nm thickness, a second superlattice of two more $Al_{0.5}Ga_{0.5}As$ layers 88 of 1.13 nm thickness and two AlAs layers 90 of 1.13 nm thickness, a third superlattice of two GaAs layers 92 of 1.13 nm thickness and two AlAs layers 64 of 1.13 nm thickness, a fourth superlattice of two more GaAs layers 96 of 1.13 nm thickness and two more $Al_{0.5}Ga_{0.5}As$ layers 98 of 1.13 nm thickness, and a fifth superlattice of two GaAs layers 100 of 1.7 nm thickness and two yet further $Al_{0.5}Ga_{0.5}As$ layers 102 of 1.13 nm thickness.

In the bottom three periods 70 of the upper mirror 22, all the layers 72, 74, 76 and 78 were doped p+ with a concentration of $2.5\times10^{18} cm^{-3}$ of Be while the concentration was raised to $5\times10^{18} cm^{-3}$ for the upper nine periods 70.

The upper mirror 22 was completed, as illustrated in FIG. 6, with another first upper mirror superlattice 76, as AlAs layer 104 of 27 nm thickness, another second upper mirror superlattice 78 and a GaAs layer 106 of 3 nm thickness. The doping continued at $5\times10^{18} cm^{-3}$ of Be. The GaAs layer 104 was delta-doped to a surface concentration of $10^{13} cm^{-2}$ Be, which was less than a monolayer of Be. The delta-doping was accomplished by turning off the other sources. Schubert et al have reported a similar type of delta-doping in an article entitled "Delta-doped ohmic contacts to n-GaAs" appearing in Applied Physics Letters, volume 49, 1986 at pages 292-294. However, their multiple delta-doping planes were all evenly spaced away from the surface within the semiconductor. An alternative to delta-doping the GaAs would be to deposit an InAs layer, delta-doping it and then covering the delta-doped InAs with a 5 nm thick GaAs layer to achieve the surface contact while preventing the oxidation of the delta-doped area.

It is noted that a total of 504 layers were performed in the MBE growth cycle to grow a heterostructure of about 5.3 $\mu$m height.

At the completion of MBE growth, the sample was quickly moved to a thermal evaporation chamber to be coated with the gold layer 24 to a thickness of 150 nm. The minimum exposure to air reduces the surface oxidation of the semiconductor. Alternatively, the semiconductor structure could be capped with As in the MBE chamber. The As cap would then be desorbed in the thermal evaporator immediately preceding the Au evaporation. Silver could be thermally deposited in place of the gold for better reflectivity. Indium or aluminum could be deposited by MBE to replace the gold layer 24 and thus avoid any possibility of oxidation.

At this stage, the wafer has a uniform planar structure and the pillar structure remains to be defined. An optical lithography process then was followed. Resist was spun onto the gold layer 24 and was contact exposed to an optical pattern and developed so as to leave the gold layer 24 exposed above the intended pillars 12. Nickel was then deposited to a thickness of approximately 0.15 $\mu$m. Chromium or titanium could replace the nickel. Any of these metals could alternatively be deposited by electrodeposition or sputter deposition. The sample was then washed in acetone so as to remove any remaining photoresist. That is, the nickel away from the pillar 12 was lifted off. A u-v stabilized photoresist, such as AZ-4110, could be used to eliminate the need for the nickel ion-milling mask.

Chemically assisted heavy-ion etching was used to reduce electrical damage to the sidewalls. Such reduction is required for lasers of small cross-section since a heavily damaged sidewall will dominate electronic effects as the cross-sectional area to sidewall area is decreased. Xenon was used for the ion species although other ions heavier than argon, such as krypton, should also reduce damage relative to argon. The reduction of surface damage on a planar surface by using xenon has been disclosed by Pang et al in a technical article entitled "Effects of ion species and adsorbed gas on dry etching induced damage in GaAs" appearing in Journal of Vacuum Science and Technology B, volume 3, 1985 at pages 398-401. The reduction of sidewall damage by use of $Cl_2$ assisted Ar milling has been discussed by Scherer et al in a technical article entitled "Electrical damage induced by ion beam etching of GaAs" appearing in Journal of Vacuum Science and Technology B, volume 6, 1988 at pages 277-279.

Figure 9:
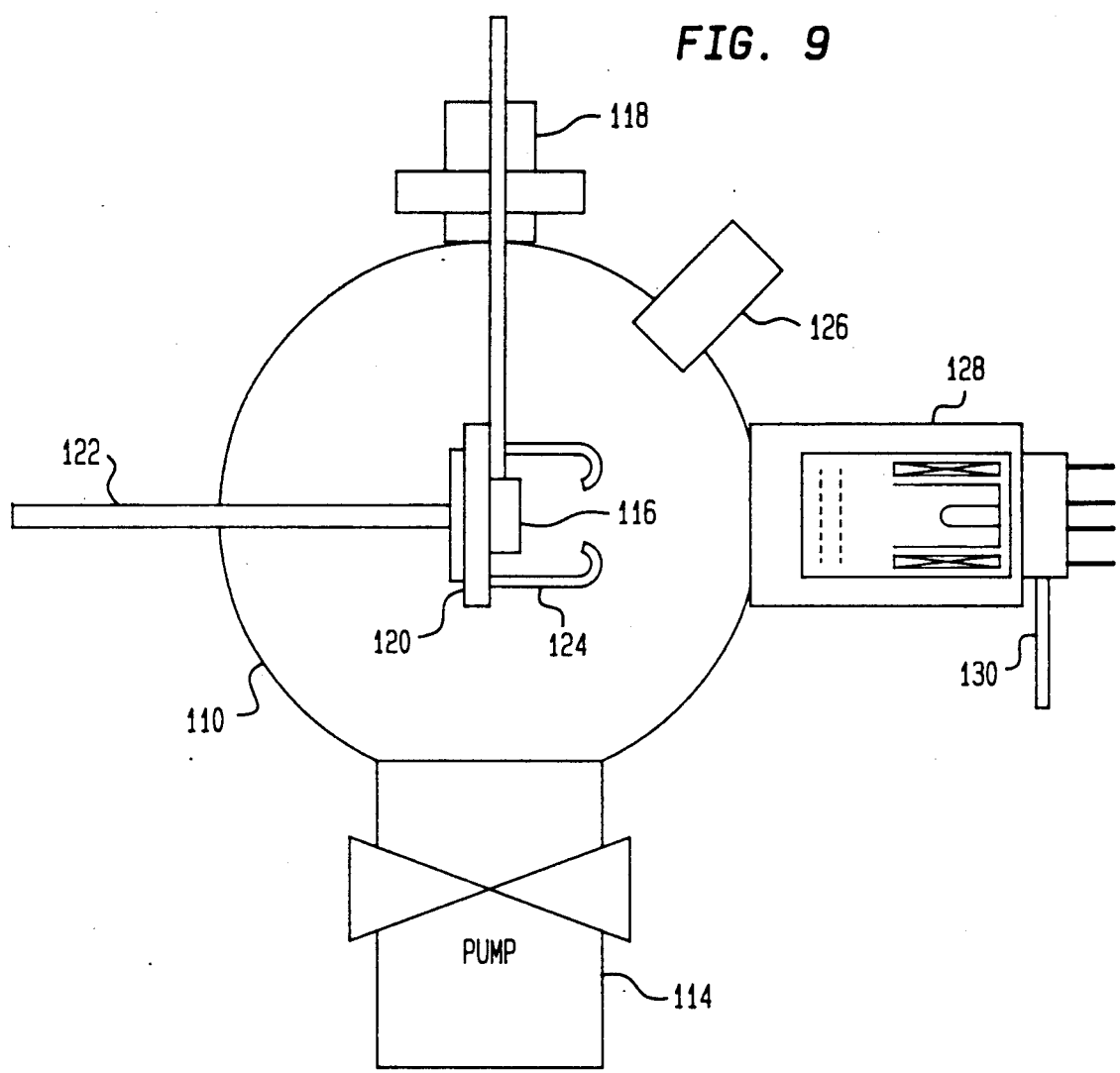
FIG. 9 is an illustration of the etching apparatus used in fabricating the embodiment of FIG. 2.

As illustrated in FIG. 9, the chemically assisted heavy-ion etching was performed in a vacuum chamber 110. A pumping stack 114 maintained a base pressure within the chamber 110 of $1\times10^{-7}$ Torr. A sample 116 was loaded into the pumped chamber 110 through a load-lock 118. The sample 116 was held on a sample holder 120 heated to 100° C. The $Cl_2$ was supplied through a reactive gas supply tube 122 connected to two nozzles 124 flooding the face of the sample 116. The $Cl_2$ gas flow was maintained at 10 sccm. A mass spectrometer 126 was used to analyze the reaction products during the etch. If desired, the $Cl_2$ could be pre-ionized to $Cl^-$, which is more chemically active, in a microwave cavity or a hot ($\approx 2000°$ C.) gas nozzle.

A Kaufmann ion source 128 was used to generate ion beams of $Xe^+$ with a voltage of 1000 eV. Xenon was supplied to the ion source 128 through an inert gas supply tube 130, to which a mass flow controller maintained a Xe flow of 4.5 sccm. The Xe ion flux at the sample was monitored with a shutter and maintained at 75 $\mu A/cm^2$. Under these conditions, the etch rate of $Xe^+/Cl_2$ was 1.2 $\mu$m/minute. The etching was continued to the full 5.5 $\mu$m height of the deposited structure. However, the etching could have been stopped just below the quantum well layer 18, which would provide better heat sinking.

The lower lead 28 was connected to the n+ substrate 10 by indium soldering although spot-welding is an alternative. It is noted that the substrate 10 could have been semi-insulating GaAs with an n+ epi-layer on its surface. The processing of the tested samples stopped at this point and the upper contact 26 was provided by a movable probe having a tip of radius ≈5 μm.

The lithographic mask provided a large number of lasers having 2, 3, 4, and 5 μm diameters on a 3×5 mm chip. The device density was about two million per square centimeter.

Figure 10:
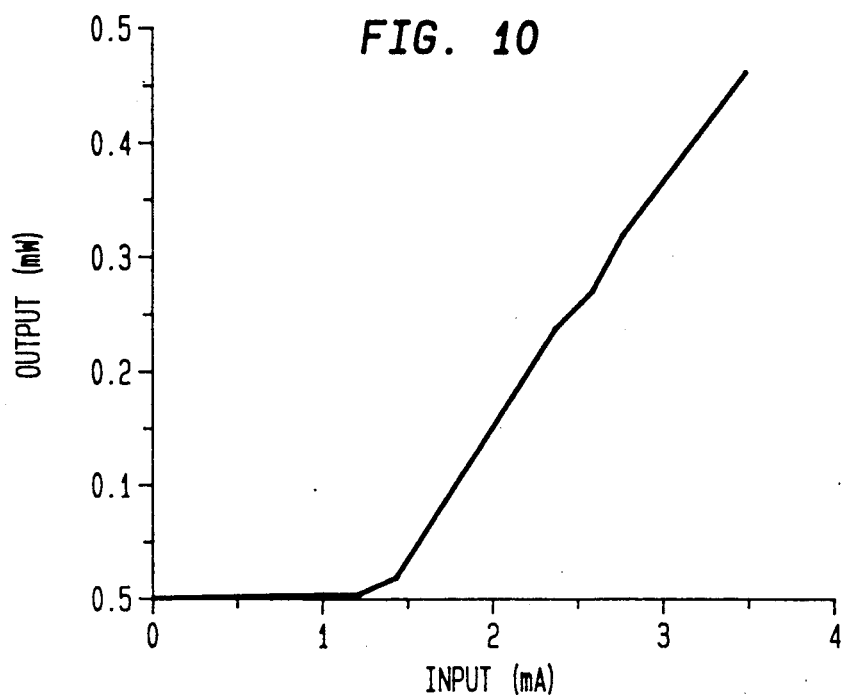
FIG. 10 is a graph of the output of a laser of the invention.

Individual lasers were driven by the lower contact 28 and the movable probe. Light was monitored through the substrate 10, which was polished on the back side. Shown in FIG. 10 is the lasing light output for a 3 μm laser at 958 nm taken with 50 ns voltage pulses at low duty cycle. At the current threshold of 1.3 mA the voltage was about 15 V rising to 20 V at 3.5 mA. The 5 μm lasers required 8 V and 2 mA for threshold. The 2 μm lasers were found to require about 20 V for threshold. The lasing wavelength varied by 1.5 nm over the chip.

Another embodiment was fabricated having a single quantum well but otherwise corresponding to the fully described embodiment. This sample showed a somewhat lower current threshold for lasing but also a lower differential quantum efficiency than the three quantum well principal embodiment.

The process described above could be improved in a number of respects. The chip with the pillar structure etched into the heterostructure could be planarized with polyimide. The polyimide would then be etched back with $O_2$ in order to expose the top contacts. Spin glass could be substituted for polyimide. It is recommended that the etched heterostructure be surface passivated with sulfur or selenium, as has been described by Sandroff et al in a technical article entitled "Electronic passivation of GaAs surfaces through the formation of arsenic-sulfur bonds", appearing in Applied Physics Letters, volume 54, 1989 at pages 362–364. Selenium passivation has been shown to reduce the threshold current by 50% in these structures. Semiinsulating AlGaAs or AlAs or insulating $SiO_2$ can then be regrown on the etched sidewalls to permanently passivate these surfaces. Then relatively thick gold deposited around the electrically insulated sidewalls can be used both for the upper contact and to heat sink the entire pillar laser. A mesa-like structure of non-circular shape could be substituted for the described circular mesas or pillars.

Although the above embodiment involved the AlGaAs family of semiconductors, there are advantages to using InP-based materials. In this case, the $Cl_2$ chemically assisted etch would be changed to HBr or $I_2$. A mixture of $CH_4:H_2$ has also been found useful for chemically assisted ion beam etching.

Low loss and small area lasers have been achieved in the described embodiments because of the strong waveguiding provided by the large refractive index difference Δn between the semiconductor pillar and the vacuum on the outside. It is well-known that cavities with low loss and small area cannot be made without incorporation of some waveguiding structure. For nonguiding structures, the following expression in terms of effective cavity length L, vacuum optical wavelength λ, refractive index n, total cavity losses per pass S, and minimum cavity cross-sectional area $A_{min}$ is valid:

$$\frac{L \cdot \lambda}{n \cdot S \cdot A_{min}} = k$$

That is, there is a minimum cross-sectional area $A_{min}$ below which lasing does not occur. For small loss S, the finesse of the cavity is equal to π/S so that S can be calculated from measured values of finesse. The exact value of the constant k depends on exactly how the area is defined (e.g., bounded by where the intensity falls to 1/e or $1/e^2$ of the maximum intensity. This constant k has been determined in a separate experiment to be about 0.25.

By normalizing this expression, a waveguiding confinement factor W for a cross-sectional area A can be defined as:

$$W = \frac{L \cdot \lambda}{0.25 \cdot n \cdot S \cdot A} = \frac{4 \cdot L \cdot \lambda}{n \cdot S \cdot A}$$

The confinement factor W will be less than unity in the case of no waveguiding and greater than unity when guiding occurs. Ibaraki et al have disclosed in a technical article entitled "Buried Heterostructure GaAs/GaAlAs Distributed Bragg Reflector Surface Emitting Laser with Very Low Threshold (5.2 mA) under Room Temperature CW Conditions" appearing in Japanese Journal of Applied Physics, volume 28, 1989, at pages L667 and L668 a weakly waveguided surface emitting laser of diameter 5 μm, length about 3 μm and losses per pass of about 5%. These quantities yield W≈3.5. By comparison, the laser of the principal embodiment includes a 2 μm diameter, 1 μm long cavity with a conservatively estimated loss of 0.9% per pass. This yields W≈40, more than 10 times that of the previously disclosed structure. The corresponding values for W of the 3 and 5 μm lasers of the principal embodiment are 17.8 and 6.4. Thus the smaller 2 and 3 μm lasers of the principal embodiment are the first demonstrated strongly waveguiding vertical cavity lasers.

This strong confinement is made possible in the disclosed structure by having a very large refractive index difference Δn between the inside and outside of the waveguide. While both the structure described here and that of Ibaraki et al has n≈3.5 inside the guide, Ibaraki et al's structure has n≈3.2 on the outside while the present device has n=1. Thus, the value of Δn for the disclosed embodiments is 2.5 versus 0.3 for Ibaraki et al. All known prior-art electrically pumped surface emitting lasers with a vertical cavity have structures similar to that of Ibaraki et al. Thus, it is highly unlikely that the prior technology can be extended to produce devices with a waveguide confinement factor much larger than 3.5.

It is not required that the laser-containing pillar be free standing in order to obtain the large refractive index difference Δn. As is shown in TABLE 1, the III–V semiconducting materials of interest have a refractive index n between 2.9 and 3.6. Alloys of these materials have similar values. Layers of these materials have an effective index intermediate between those of the constituent layers.

TABLE 1

|  | n |
|---|---|
| GaAs | 3.5 |
| AlAs | 2.9 |
| InGaAs | 3.6 |
| ZnS | 2.5 |
| air/vacuum | 1.0 |
| glass | 1.5 |

On the other hand, most non-III–V materials that would be used in conjunction therewith have a refractive index n that is substantially less. Therefore, the III-V material in the pillar should be surrounded by non-III-V material. However, there are several considerations. The pillar may have its sidewalls passivated by a thin layer of AlGaAs. As long as the thickness of this passivating layer is considerably less than an optical wavelength, taking into account the local refractive index, it will have small effect on the effective refractive index difference $\Delta n$. Also, at a large optical distance from the pillar of approximately $10 \cdot \lambda$ or more, approximately 10 $\mu$m, the presence of a III-V material would have little effect. Based on these observations, a general rule for obtaining a large refractive index difference $\Delta n$ is that the III-V pillar defining the resonant cavity between the mirrors be surrounded on its sides by a continuous region of material not containing any III-V semiconducting material. This continuous non-III-V region should be located within at least an optical distance of $10 \cdot \lambda$ of the pillar and have a thickness of at least $\lambda/100$.

By means of the novel structure and processing of the present invention, very small and efficient semiconductor lasers have been achieved. They have been built of materials amenable to electronic integrated circuits. Accordingly, such lasers can be incorporated into laser arrays in opto-electronic circuits.

What is claimed is:

1. A method of fabricating a vertically oriented semiconducting optical structure, comprising the steps of:
   epitaxially forming on a crystalline body a vertical structure comprising a plurality of semiconductive layers of differing compositions, said vertical structure including an active region having an effective bandgap, a first interference mirror and another mirror substantially reflecting light of a wavelength corresponding to said bandgap, an optical distance between said interference mirror and said another mirror being in a predetermined relationship with said wavelength; and
   vertically etching with an ion beam comprising ions heavier than argon through a portion of said vertical structure including at least said active region to form an isolated pillar of at least some of said semiconductive layers.

2. A method as recited in claim 1, wherein said ions comprise xenon ions.

3. A method as recited in claim 2, wherein said etching step further comprises exposing said vertical structure to a reactive gas during said ion beam etching.

4. A method as recited in claim 3, further comprising attaching a first electrical connection to a portion of said vertical structure above both of said mirrors and a second electrical connection to said crystalline body.

5. A method as recited in claim 3, wherein said another mirror comprises a second interference mirror.

6. A method as recited in claim 4, wherein said another mirror comprises a second interference mirror.

7. A method as recited in claim 6, wherein said first electrical connection comprises a metallic layer deposited on an epitaxially formed one of said layers prior to said etching step.

8. A method as recited in claim 7, wherein said active region comprises at least one quantum well layer.

9. A method as recited in claim 8, wherein said at least one quantum well layer consists of three quantum well layers.

10. A method as recited in claim 5, wherein said etching step etches through substantially all of said two mirrors.

11. A method as recited in claim 6, wherein said depositing step includes doping said first interference mirror to a first semiconductivity type of a concentration substantially higher than a doping concentration of said active region and doping said second interference mirror to a second semiconductivity type of a concentration substantially higher than said active region doping concentration.

12. A method as recited in claim 11, further comprises depositing less than a monolayer of a dopant of said second conductivity type on an uppermost surface of said second interference mirror and wherein said first electrical connection comprises a metallic layer deposited on said uppermost surface.

13. A method of fabricating a vertical semiconductor diode laser, comprising the steps of:
   forming on a body a vertical structure comprising a plurality of layers, at least some of which comprise semiconductor layers epitaxial with said substrate, said structure including a lower mirror, a lower spacer, an active semiconductor layer emitting light at a wavelength, an upper spacer and an upper mirror, an optical distance between said lower and upper mirrors being in a predetermined relationship to said wavelength, said upper and lower mirrors reflecting a substantial fraction of light at said wavelength;
   vertically etching a portion of said structure to form a pillar rising away from said substrate; and
   a first step of electrically connecting a first electrical contact to a portion of said pillar above said active layer; and
   a second step of electrically connecting a second electrical contact to a portion of said vertical structure below said active layer;
   wherein said vertical etching step causes electrical current between said two contacts to be confined to an area of said active layer corresponding to said pillar.

14. A method as recited in claim 13, wherein said vertically etching step etches at least through said active layer.

15. A method as recited in claim 13, wherein said vertically etching step comprises etching with a beam of ions heavier than argon.

16. A method as recited in claim 15, wherein said vertically etching step further comprises exposing said structure to a reactive gas during said etching with a beam.

17. A method as recited in claim 13, wherein said forming step forms at least one of said mirrors as a multi-layer interference mirror.

18. A method as recited in claim 17, wherein said multi-layer interference mirror is a semiconductor interference mirror and one of said first and second contacts is operatively attached to said semiconductor interference mirror to form a current path therethrough.

19. A method as recited in claim 18, wherein said semiconductor interference mirror is said upper mirror.

20. A method as recited in claim 13, wherein said vertically etching step forms a plurality of said pillars and wherein said first connecting step connects a plurality of said first electrical contacts to respective ones of said pillars, whereby a plurality of laser diodes are formed.

* * * * *